United States Patent
Sheng

(10) Patent No.: US 8,117,586 B2
(45) Date of Patent: Feb. 14, 2012

(54) PRINTED CIRCUIT BOARD LAYOUT SYSTEM AND METHOD THEREOF

(75) Inventor: Xiao-Cheng Sheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 90 days.

(21) Appl. No.: 12/835,701

(22) Filed: Jul. 13, 2010

(65) Prior Publication Data

US 2011/0035719 A1 Feb. 10, 2011

(30) Foreign Application Priority Data

Aug. 10, 2009 (CN) .......................... 2009 1 0305422

(51) Int. Cl.
G06F 17/50 (2006.01)

(52) U.S. Cl. ........ 716/137; 716/106; 716/110; 716/111; 716/126; 716/139

(58) Field of Classification Search .................. 716/102, 716/104, 106, 110, 111, 126, 136, 137, 139
See application file for complete search history.

(56) References Cited

U.S. PATENT DOCUMENTS

| | | | |
|---|---|---|---|
| 7,100,137 B2* | 8/2006 | Teig et al. | 716/123 |
| 7,228,514 B2* | 6/2007 | Chan et al. | 716/113 |
| 7,331,022 B1* | 2/2008 | Pritchard et al. | 716/126 |
| 7,519,937 B2* | 4/2009 | Ting et al. | 716/101 |
| 7,533,360 B1* | 5/2009 | Ren et al. | 716/126 |
| 7,546,571 B2* | 6/2009 | Mankin et al. | 716/137 |
| 7,627,838 B2* | 12/2009 | Keswick | 716/132 |
| 7,793,249 B1* | 9/2010 | Wadland et al. | 716/129 |
| 7,992,121 B2* | 8/2011 | Gupta et al. | 716/128 |
| 2008/0301600 A1* | 12/2008 | Kumagai | 716/5 |

* cited by examiner

*Primary Examiner* — Paul Dinh
*Assistant Examiner* — Nha Nguyen
(74) *Attorney, Agent, or Firm* — Altis Law Group, Inc.

(57) ABSTRACT

A method for automatically checking signal areas includes: recording etching line information of etching lines which divide an internal plane of an opened PCB file into a plurality of signal areas, recording input signal names and positions where the input signal names are arranged, obtaining the outline information of the opened internal plane and the etching line information, obtaining position information of points within each signal areas according to the outline information and the etching line information, determining whether one signal area is associated with one input signal name, determining whether the one input signal name matches one standard signal name, and setting one input signal name as a name attribute of the signal area associated with the one input signal name if the one input signal name matches one standard signal name. A related PCB system is also provided.

14 Claims, 6 Drawing Sheets

PRINTED CIRCUIT BOARD LAYOUT SYSTEM AND METHOD THEREOF

BACKGROUND

1. Technical Field

The present disclosure relates to printed circuit board (PCB) layout field and, particularly, to a PCB layout system and a method thereof.

2. Description of Related Art

When designing PCB layouts using a PCB layout software, the software needs to divide an internal plane of a PCB layout file into different signal areas and assign each signal area with a correct signal name. Conventionally, a designer inputs each signal name in each signal area and sets one input signal name to a name attribute of one signal area associated with the input signal name one by one. If there are many signal areas, it is easy for the designer to input the wrong signal names or omit some signal areas. To ensure each signal area is assigned with a correct signal name, the designer usually needs to carefully check all the signal areas one by one after inputting the signal names, which is tedious and troublesome.

BRIEF DESCRIPTION OF THE DRAWINGS

The components of the drawings are not necessarily drawn to scale, the emphasis instead being placed upon clearly illustrating the principles of a PCB layout system and a method thereof. Moreover, in the drawings, like reference numerals designate corresponding parts throughout several views.

DETAILED DESCRIPTION

Figure 1:
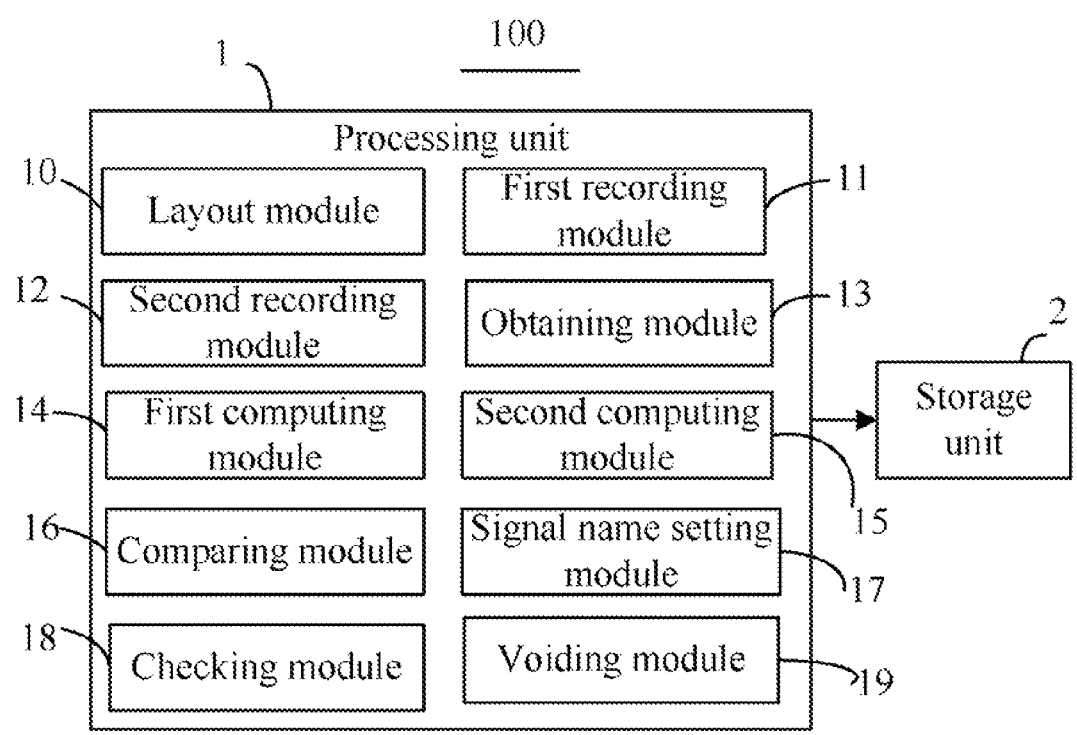
FIG. 1 is a block diagram of a PCB layout system in accordance with one embodiment.

Referring to FIG. 1, an embodiment of a PCB layout system 100 is illustrated. The system 100 includes a processing unit 1 and a storage unit 2.

The storage unit 2 is configured to store PCB layout files and a standard signal name file listing all standard signal names of the system 100. Each PCB layout file is created based on a schematic circuit diagram, similar to the process of converting schematic circuit diagrams to PCB layouts by any conventional PCB layout software. Outline information is also created together with each PCB layout file, defining an outline of an internal plane of the PCB layout file. The outline information can be recorded in the corresponding PCB layout file. The outline information may include a plurality of coordinates defining a plurality of points joined together to form the outline.

The processing unit 1 includes a layout module 10, a first recording module 11, a second recording module 12, an obtaining module 13, a first computing module 14, a second computing module 15, a comparing module 16, a signal name setting module 17, and a checking module 18.

Figure 2:
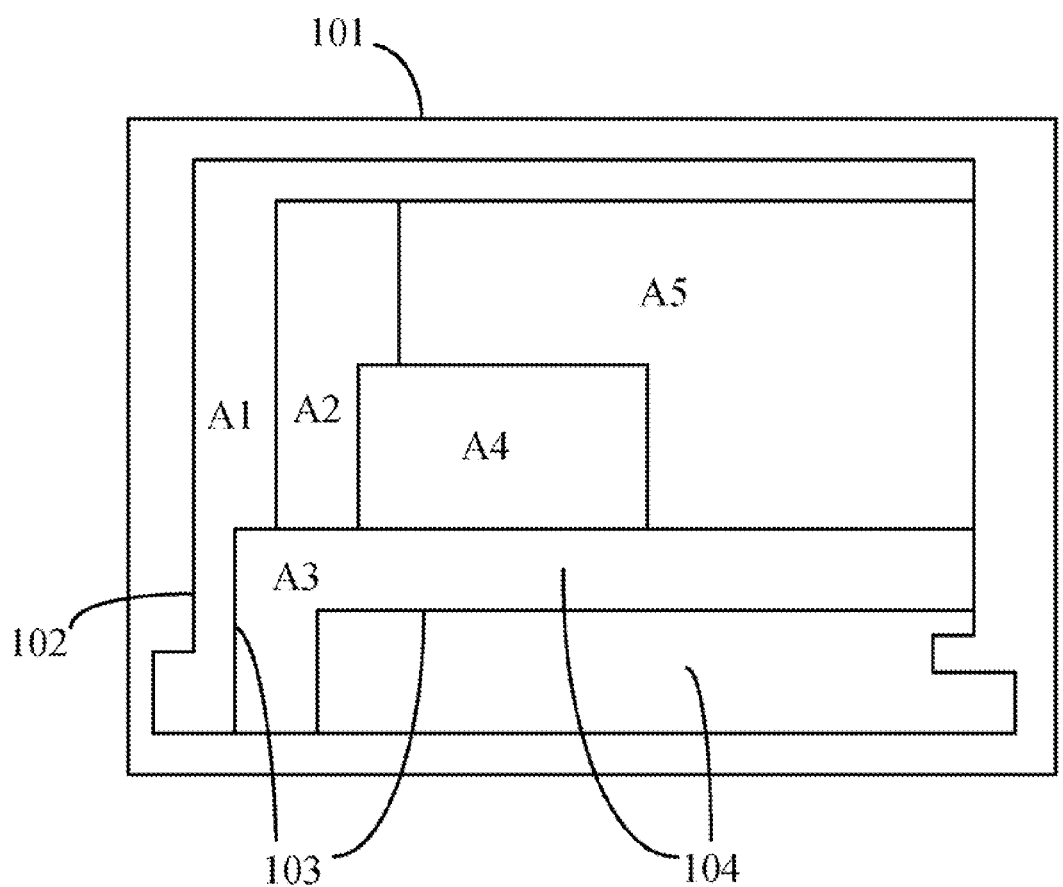
FIG. 2 is a schematic diagram showing an outline, etching lines, and input signal names displayed in a user interface of the PCB layout system of FIG. 1.

The layout module 10 is configured to generate PCB layout files according to schematic circuit diagrams and output a user interface 101 for displaying contents, for example, an outline 102 of an internal plane of an opened PCB layout file (see FIG. 2).

The first recording module 11 is configured to record etching line information of etching lines 103 (see FIG. 2) drawn by a designer. The etching lines 103 are used to divide the internal plane into a plurality of signal areas 104. The etching line information may include a plurality of coordinates defining a plurality of points joined together to form the etching lines 103.

The second recording module 12 is configured to record signal names inputted by the designer and positions where the input signal names are arranged.

The obtaining module 13 is configured to obtain the outline information and the etching line information in response to user input.

The first computing module 14 is configured to perform a logical operation according to the outline information and the etching line information to obtain the position information of the points within each of the signal areas 104.

The second computing module 15 is configured to perform an intersection operation to determine whether one signal area 104 is associated with one signal name. Specifically, if the second computing module 15 determines that the intersection of the position information of the points within one signal area 104 and the position of one input signal name is not null, the second computing module 15 determines that the signal area 104 is assigned with the input signal name.

The comparing module 16 is configured to compare one input signal name associated with one signal area 104 with the standard signal names listed in the signal name file to determine whether the input signal name matches one standard signal name.

Figure 3:
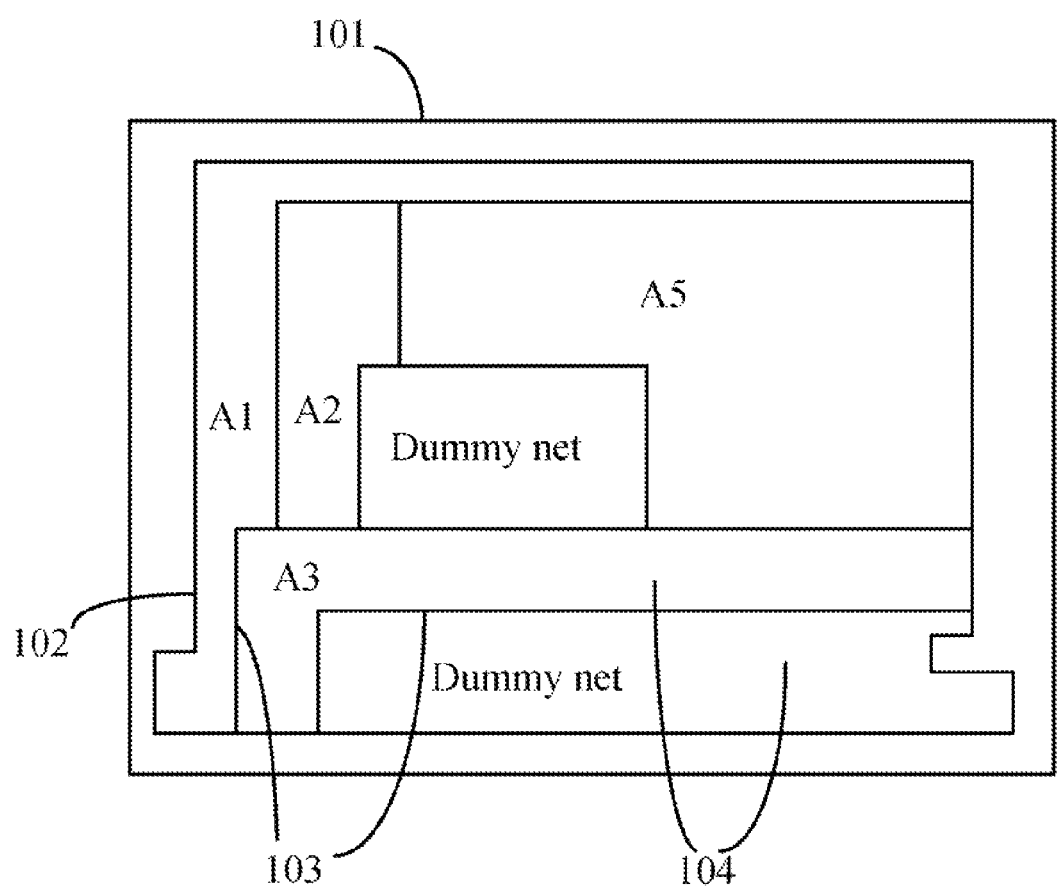
FIG. 3 is a schematic diagram showing default signal names displayed in the user interface of the PCB layout system of FIG. 1.

If one input signal name matches one standard signal name, the signal name setting module 17 sets the input signal name as a name attribute of the signal area 104 associated with the input signal name. Otherwise, the signal name setting module 17 replaces the input signal name with a default signal name, for example "Dummy net," and sets the default name as the name attribute of the signal area 104 (see FIG. 3). It should be noted that if one signal area 104 is not associated with any input signal name, the signal name setting module 17 can display the default signal name in the signal area 104 and set the default signal name as the name attribute of the signal area 104.

The checking module 18 is configured to check whether the name attribute of each of the signal areas 104 is set to one input signal name or the default signal name. If yes, the checking module 18 prompts that all the signal areas 104 are checked. If there is one signal area 104 whose name attribute is not set to one input signal name or the default signal name, the system 100 further sets the name attribute of the signal area 104 to one input signal name or the default signal name as described above.

With such a configuration, the designer can quickly know which signal area 104 is not associated with a standard signal name just by checking the signal areas 104 where the default signal names are displayed, without checking all the signal areas 104 one by one.

Figure 4:
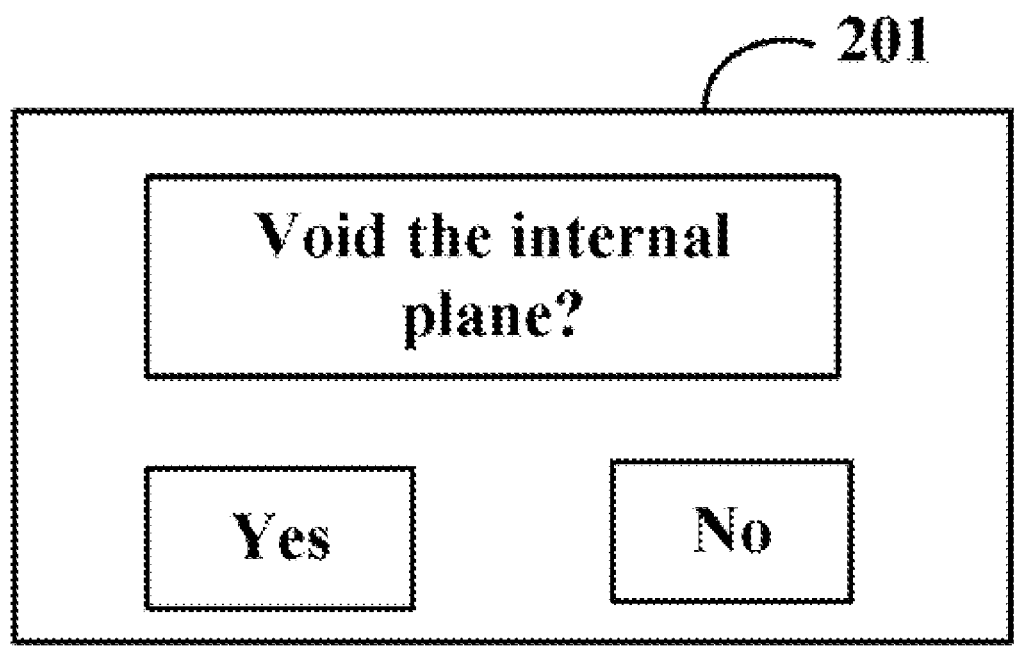
FIG. 4 is a schematic diagram showing a prompt window of the PCB layout system of FIG. 1.

The processing unit 1 can further include a voiding module 19. The voiding module 19 obtains the name of the internal plane of the opened PCB layout file in response to user input and determines whether the internal plane is positive according to the obtained name. If the internal plane is positive, the voiding module 19 outputs a prompt window 201 (as shown in FIG. 4) to prompt whether to void the internal plane. If the designer makes a selection for voiding the internal plane, the voiding module 19 voids the internal plane.

Figure 5A:
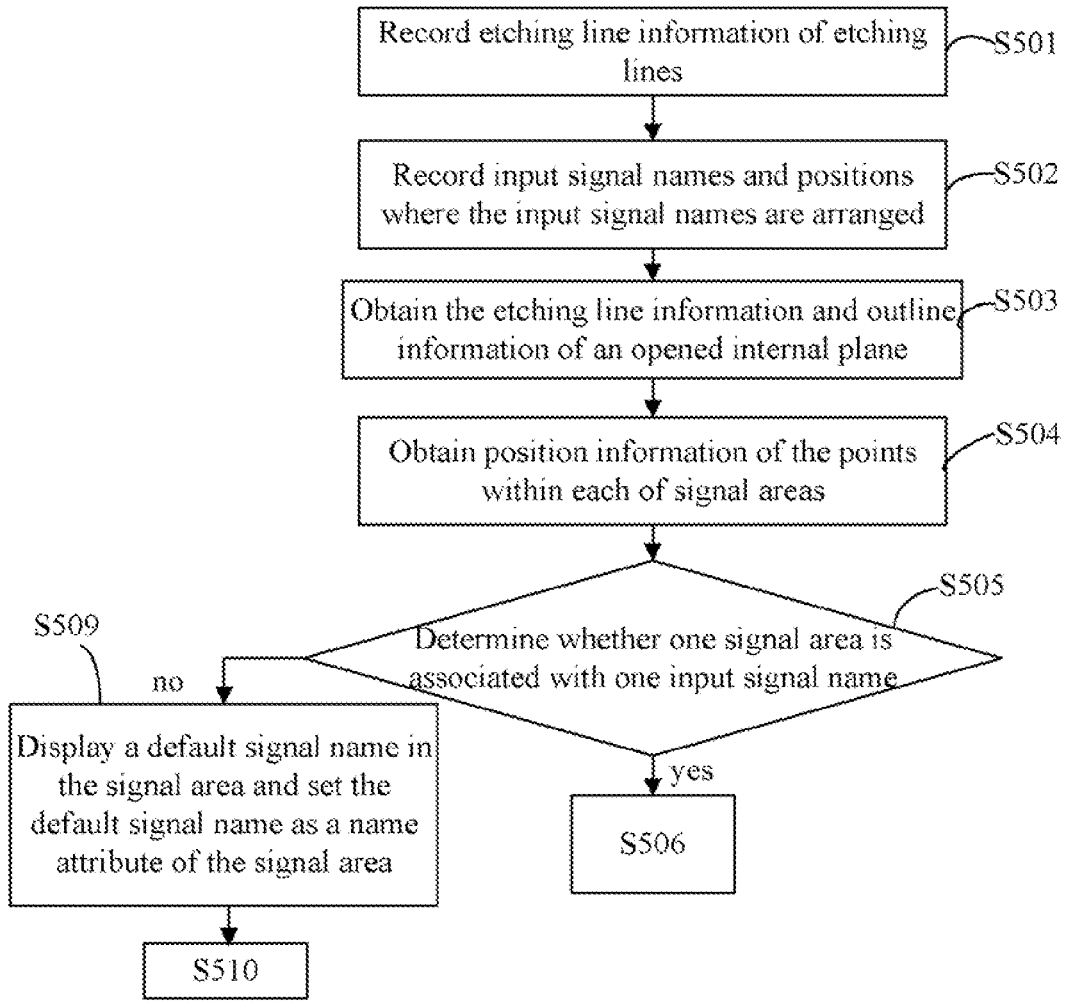
FIGS. 5A-5B are flowcharts of a method for automatically checking signal areas in accordance with one embodiment.
Figure 5B:
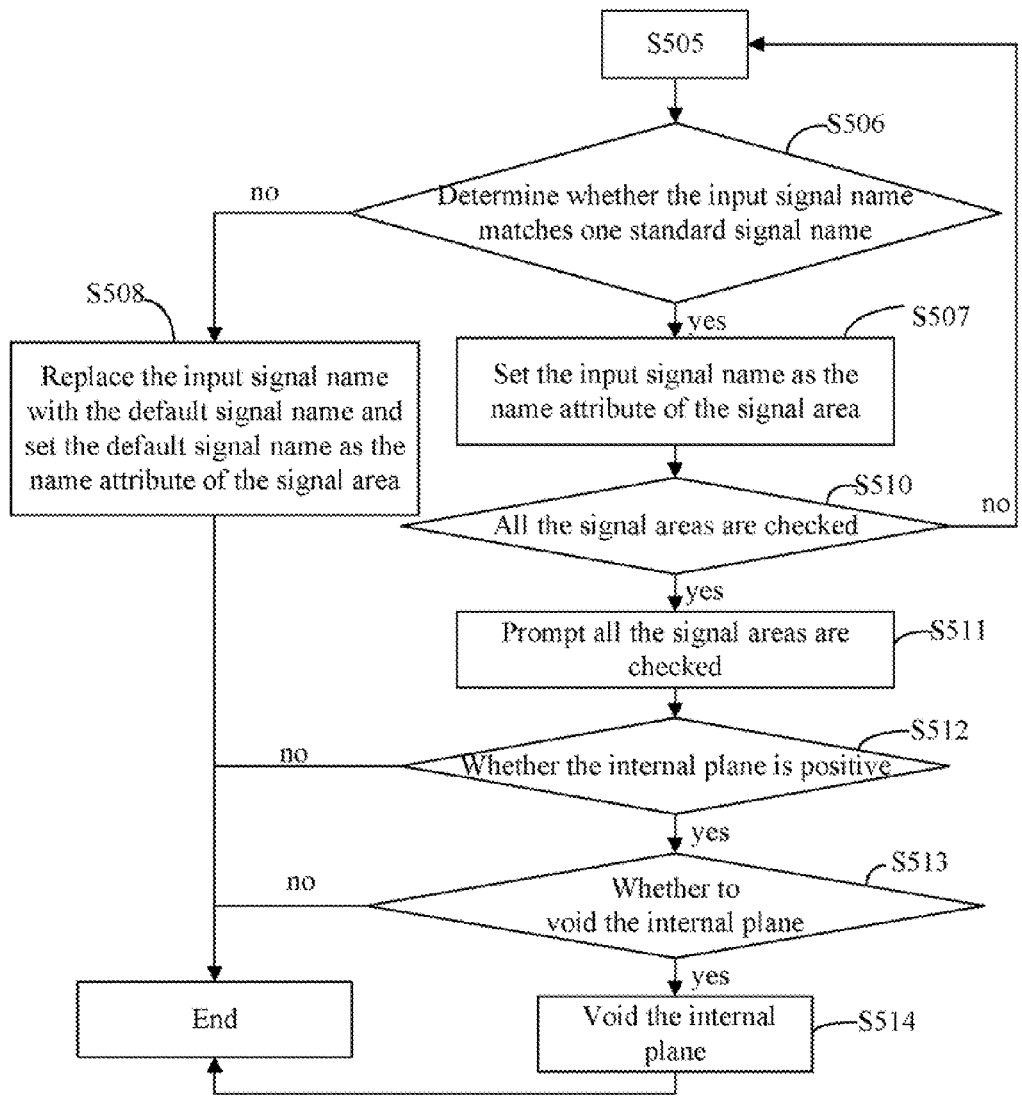

Referring to FIGS. 5A and 5B, a flowchart of one embodiment of a method for automatically checking signal areas is illustrated. Depending on the embodiment, certain of the steps described below may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

In step S501, the first recording module 11 records the etching line information of the etching lines 103.

In step S502, the second recording module 12 records the input signal names and the positions where the input signal names are arranged.

In step S503, the obtaining module 13 obtains the outline information of the outline 102 of the internal plane and the etching line information in response to user input.

In step S504, the first computing module 14 performs the logical operation according to the outline information and the etching line information to obtain the position information of the points within each of the signal areas 104.

In step S505, the second computing module 15 performs the intersection operation to determine whether one signal area 104 is associated with one input signal name. If yes, the procedure goes to step S506, otherwise the procedure goes to step S509.

In step S506, the comparing module 16 compares the input signal name with the standard signal names to determine whether the input signal name matches one of the standard signal names. If yes, the procedure goes to step S507, otherwise the procedure goes to step S508

In step S507, the signal name setting module 17 sets the input signal name as the name attribute of the signal area 104.

In step S508, the signal name setting module 17 replaces the input signal name with the default signal name and sets the default signal name as the name attribute of the signal area 104.

In step S509, the signal name setting module 17 displays the default signal name in the signal area 104 and sets the default signal name as the name attribute of the signal area 104.

In step S510, the checking module 18 checks whether there is one signal area 104 whose name attribute is not set to one input signal name or the default signal name. If yes, the procedure returns to step S505, otherwise the procedure goes to step S511.

In step S511, the checking module 18 prompts that all the signal areas 104 are checked.

In step S512, the voiding module 19 determines whether the internal plane is positive according to the name of the internal plane. If the internal plane is positive, the procedure goes to step S513, otherwise the procedure ends.

In step S513, the voiding module 19 outputs the prompt window 201 to prompt whether to void the internal plane. If the designer makes the selection for voiding the internal plane, the procedure goes to step S514, otherwise the procedure ends.

In step S514, the voiding module 19 voids the internal plane.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. A printed circuit board (PCB) layout system, comprising:
   a storage unit storing a plurality of PCB layout files and a signal name file listing all signal names of the PCB layout system, each of the PCB layout files comprising outline information defining an outline of an internal plane of each of the PCB layout files; and
   a processing unit executing a plurality of executions to:
      display an outline of an internal plane of an opened PCB layout file;
      record etching line information of etching lines, wherein the etching lines divide the internal plane into a plurality of signal areas;
      record input signal names and positions where the input signal names are arranged;
      obtain the outline information of the internal plane and the etching line information in response to user input;
      perform a logical operation according to the obtained outline information and the obtained etching line information to obtain the position information of points within each of the signal areas;
      perform an intersection operation to determine whether one of the signal areas is associated with one of the input signal names;
      compare one of the input signal names associated with one of the signal areas with the signal names in the signal name file to determine whether the one of the input signal names matches one of the signal names in the signal name file; and
      set one of the input signal names as a name attribute of the signal area associated with the one of the input signal names if the one of the input signal names matches one of the signal names in the signal name file; and
      wherein the processing unit further comprises executions to replace one input signal name which does not match any signal name in the signal name file with a default signal name and set the default signal name as a name attribute of one signal area associated with the one input signal name.

2. The PCB layout system as described in claim 1, wherein the outline information of each of the outlines comprises a plurality of coordinates defining a plurality of points joined together to form each of the outlines.

3. The PCB layout system as described in claim 1, wherein the etching line information comprises a plurality of coordinates defining a plurality of points joined together to form the etching lines.

4. The PCB layout system as described in claim 1, wherein the processing unit further comprises executions to display a default signal name in one signal area without one associated input signal name and set the default signal name as a name attribute of the one signal area.

5. The PCB layout system as described in claim 1, wherein the processing unit further comprise executions to check whether a name attribute of each of the signal areas is set to one input signal name or a default signal name, and prompt that all the signal areas are checked if the name attribute of each of the signal areas is set to one input signal name or the default signal name.

6. The PCB layout system as described in claim 1, wherein the processing unit further comprises executions to determine whether the internal plane is positive according to the name of the internal plane and output a prompt window to prompt whether to automatically void the internal plane if the internal plane is positive.

7. The PCB layout system as described in claim 6, wherein the processing unit further comprises an execution to automatically void the internal plane if a command for voiding the internal plane is input via the prompt window.

8. A method for automatically checking signal areas applied in a printed circuit board (PCB) system, the PCB system comprising a plurality of PCB layout files and a name file listing all signal names of the PCB layout system, each of the PCB layout files comprising outline information defining an outline of an internal plane of each of the PCB layout files, the method comprising:
- recording etching line information of etching lines, wherein the etching lines divide an opened internal plane into a plurality of signal areas;
- recording input signal names and positions where the input signal names are arranged;
- obtaining the outline information of the opened internal plane and the etching line information in response to user input;
- performing, by using a computer, a logical operation according to the obtained outline information and the obtained etching line information to obtain position information of points within each of the signal areas;
- performing an intersection operation to determine whether one of the signal areas is associated with one of the input signal names;
- comparing one of the input signal names associated with one of the signal areas with the signal names in the signal name file to determine whether the one of the input signal names matches one of the signal names in the signal name file; and
- setting one of the input signal names as a name attribute of the signal area associated with the one of the input signal names if the one of the input signal names matches one of the signal names in the signal name file; and
- replacing one input signal name which does not match any signal name in the signal name file with a default signal name and setting the default signal name as a name attribute of one signal area associated with the one input signal name.

9. The method as described in claim 8, wherein the outline information of each of the outlines comprises a plurality of coordinates defining a plurality of points joined together to form each of the outlines.

10. The method as described in claim 8, wherein the etching line information comprises a plurality of coordinates defining a plurality of points joined together to form the etching lines.

11. The method as described in claim 8 further comprising:
- displaying a default signal name in one signal area without one associated input signal name setting the default signal name as the name attribute of the one signal area.

12. The method as described in claim 8 further comprising:
- checking whether a name attribute of each of the signal areas is set to one input signal name or a default signal name; and
- prompting that all the signal areas are checked if the name attribute of each of the signals is set to one input signal name or the default signal name.

13. The method as described in claim 8 further comprising:
- determining whether the opened internal plane is positive according to the name of the opened internal plane; and
- outputting a prompt window to prompt whether to automatically void the opened internal plane if the opened internal plane is positive.

14. The method as described in claim 13 further comprising:
- automatically voiding the opened internal plane if a command for voiding the opened internal plane is input via the prompt window.

* * * * *